(12) United States Patent
Matsunaga

(10) Patent No.: US 11,271,178 B2
(45) Date of Patent: Mar. 8, 2022

(54) FLEXIBLE SUBSTRATE

(71) Applicant: Japan Display Inc., Minato-ku (JP)

(72) Inventor: Kazuki Matsunaga, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/930,573

(22) Filed: May 13, 2020

(65) Prior Publication Data

US 2020/0274082 A1 Aug. 27, 2020

Related U.S. Application Data

(63) Continuation of application No. PCT/JP2018/041186, filed on Nov. 6, 2018.

(30) Foreign Application Priority Data

Nov. 24, 2017 (JP) .............................. JP2017-225524

(51) Int. Cl.
*H01L 51/00* (2006.01)
*H01L 27/32* (2006.01)

(52) U.S. Cl.
CPC .......... *H01L 51/0097* (2013.01); *H01L 27/32* (2013.01)

(58) Field of Classification Search
CPC ............................. H01L 51/0097; H01L 27/32
See application file for complete search history.

(56) References Cited

U.S. PATENT DOCUMENTS

| | | | | |
|---|---|---|---|---|
| 9,316,858 B2* | 4/2016 | Yabuta | ................ | G02F 1/13338 |
| 9,887,256 B2* | 2/2018 | Kim | ................... | H01L 27/3265 |
| 10,270,059 B2* | 4/2019 | Kim | ................... | H01L 51/0097 |
| 10,483,098 B2* | 11/2019 | Um | ...................... | H01L 27/1262 |
| 10,608,024 B2* | 3/2020 | Lee | ...................... | H01L 27/124 |
| 10,686,148 B2* | 6/2020 | Jang | ..................... | H01L 27/3276 |
| 10,734,462 B2* | 8/2020 | Nishinohara | ....... | H01L 27/3276 |
| 10,847,545 B2* | 11/2020 | Lee | ........................ | H01L 27/124 |
| 2014/0240650 A1* | 8/2014 | Motooka | ............ | G02F 1/13452 349/110 |
| 2015/0048349 A1 | 2/2015 | Kawata et al. | | |

(Continued)

FOREIGN PATENT DOCUMENTS

JP 2008-116779 A 5/2008
JP 2016-31499 A 3/2016

OTHER PUBLICATIONS

International Search Report dated Jan. 29, 2019 in PCT/JP2018/041186 filed Nov. 6, 2018, 3 pages.

(Continued)

*Primary Examiner* — Ida M Soward
(74) *Attorney, Agent, or Firm* — Oblon, McClelland, Maier & Neustadt, L.L.P.

(57) ABSTRACT

A flexible substrate includes a substrate having a first surface and a second surface opposite the first surface, an array part arranged on the first surface of the substrate, a peripheral part arranged on the first surface of the substrate and located outside the array part, a terminal part arranged in the peripheral part and provided with a plurality of terminals, a protective member arranged on the second surface of the substrate. The second surface of the substrate has a first region including a region overlapping the terminal part, and the protective member has a first opening exposing the first region.

9 Claims, 18 Drawing Sheets

(56) References Cited

U.S. PATENT DOCUMENTS

| | | | |
|---|---|---|---|
| 2016/0141312 A1* | 5/2016 | Nakatani | H01L 27/1225 |
| | | | 349/43 |
| 2016/0174304 A1 | 6/2016 | Kim et al. | |
| 2016/0306488 A1* | 10/2016 | Kim | G06F 1/1626 |
| 2017/0250366 A1* | 8/2017 | Andou | H01L 51/5237 |
| 2017/0288007 A1* | 10/2017 | Shin | H01L 27/3262 |
| 2017/0352692 A1* | 12/2017 | Lee | H01L 24/29 |
| 2018/0083211 A1* | 3/2018 | Lee | H01L 27/3258 |
| 2018/0090698 A1* | 3/2018 | Jeong | H01L 27/3276 |
| 2018/0108863 A1* | 4/2018 | Kajiyama | H01L 27/3276 |
| 2018/0314099 A1* | 11/2018 | Saitoh | G02F 1/1345 |
| 2019/0115396 A1* | 4/2019 | Hiraga | H01L 27/124 |
| 2020/0303665 A1* | 9/2020 | Saeki | H01L 51/0097 |

OTHER PUBLICATIONS

Office Action dated Jan. 19, 2021 in corresponding Japanese Patent Application No. 2017-225524 (with English Translation), 9 pages.

\* cited by examiner

FLEXIBLE SUBSTRATE

CROSS-REFERENCE TO RELATED APPLICATIONS

This application is based upon and claims the benefit of priority from the prior Japanese Patent Application No. 2017-225524, filed on Nov. 24, 2017, and PCT Application No. PCT/JP2018/041186 filed on Nov. 6, 2018, the entire contents of which are incorporated herein by reference.

FIELD

One embodiment of the present invention relates to a flexible device or a display device using a bendable flexible board.

BACKGROUND

As a display device used in an electronic device, a Liquid Crystal Display Device using an electro-optical effect of liquid crystal, an organic EL display device using an organic electroluminescence (organic EL) element, and the like have been developed and put into practical use.

In particular, when the organic EL element is used as a display element, a high viewing angle and a high-definition display are possible, and it is characterized in that it can be formed on a flexible board. Japanese Laid-Open Patent Publication No. 2016-031499 and U.S. Patent Application Publication No. 2016/0174304 disclose the display device capable of folding the flexible board in a wiring part connecting a pixel array portion and a peripheral circuit portion. Thus, the frame (Bezel) portion of the display device can be narrowed, and the display device can be miniaturized.

At the end of the flexible board, a flexible printed circuit is placed. When crimping the flexible board and the flexible printed circuit, deformation of the board may occur in the crimped portion, and the flatness of the board may deteriorate.

SUMMARY

A flexible substrate in an embodiment according to the present invention includes a substrate having a first surface and a second surface opposite the first surface, an array part arranged on the first surface of the substrate, a peripheral part arranged on the first surface of the substrate and located outside the array part, a terminal part arranged in the peripheral part and provided with a plurality of terminals, a protective member arranged on the second surface of the substrate. The second surface of the substrate has a first region including a region overlapping the terminal part, and the protective member has a first opening exposing the first region.

DESCRIPTION OF EMBODIMENTS

Hereinafter, one embodiments of the present invention will be described with reference to the drawings. It should be noted that the present disclosure is merely an example, and those which a person skilled in the art can easily conceive of as appropriate changes while maintaining the gist of the invention are naturally included in the scope of the present invention. Also, in order to clarify the description, the drawings may be represented schematically with respect to the width, thickness, shape, etc. of each part in comparison with the actual embodiment, but this is only an example, and the interpretation of the present invention is not limited.

In addition, in the present specification and each of the drawings, elements similar to those described above with respect to the previously mentioned figures are denoted by the same reference letters, and detailed description thereof may be omitted as appropriate. Furthermore, the characters "first" and "second" for each element are convenient signs used to distinguish each element and have no further meaning unless otherwise stated.

Also, in this specification, when a member or region is described as being "above (or below)" of another member or region, unless otherwise specified, this includes both cases where it is located directly above (or immediately below) the other member or region and where it is located above (or lower) the other member or region. In other words, it also includes a case where another component is included above (or lower) another member or region. In the following description, unless otherwise specified, the side on which the display element is arranged with respect to the substrate is referred to as "surface" or in a cross-sectional view, and the opposite side is referred to as "back surface" or "below".

In the present specification, expressions such as "α includes A, B, or C", "α include any of A, B, and C", and "α includes one selected from the group consisting of A, B, and C" do not exclude the case where α includes a plurality of combinations of A to C unless otherwise specified. Furthermore, these expressions do not exclude the case where α includes other elements.

Configuration of Display Device

Figure 1:
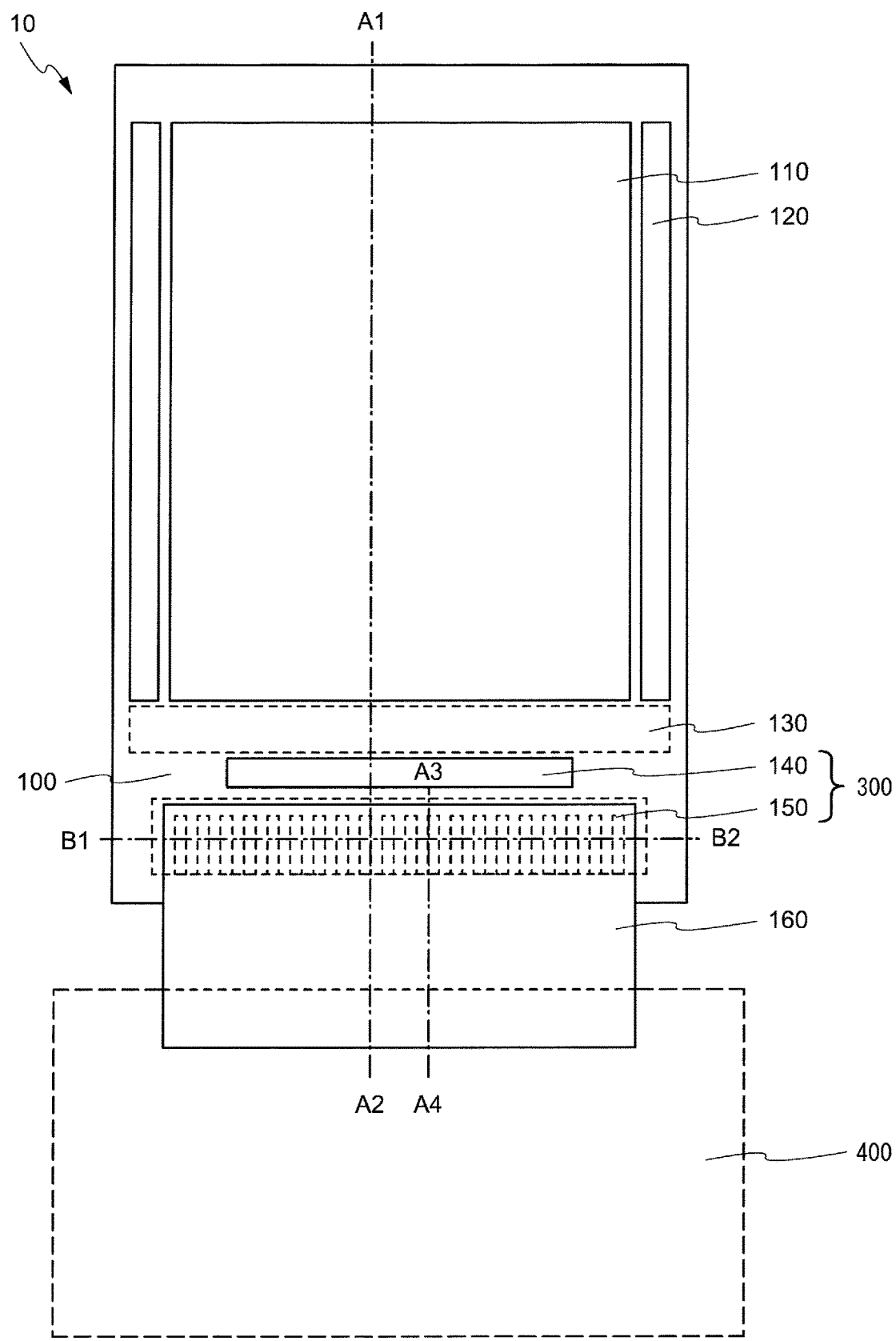
FIG. 1 is a top view of a display device according to an embodiment of the present invention.

FIG. 1 is a top view of the display device according to an embodiment of the present invention. As shown in FIG. 1, a display device 10 includes a substrate 100, a display part (an array part) 110, a scanning line driving circuit 120, a signal line driving circuit 140, a terminal part 150 having terminals to which wirings connected to the display part and/or the signal line driving circuit 140 are connected, and a flexible printed circuit 160. A region located outside the display part 110 and positioned with the signal line driving circuit 140 and the terminal part 150 is referred to as a peripheral part 300. The display device 10 may include an intermediate region 130 between the display part 110 and the peripheral part 300. In this instance, the display device 10 includes the intermediate region 130. An optional region 400 may also be connected to the flexible printed circuit 160. For convenience, FIG. 1, a protective layer 170 described later is omitted.

For the substrate 100, an organic resin material is used as a foldable material. For example, the organic resin material such as polyimides, acrylics, epoxies, and polyethylene terephthalates are used for the substrate 100. The thickness of the substrate 100 is appropriately set between 10 μm and several hundred micrometer. The substrate 100 is also called a flexible substrate.

The display part 110 is provided with pixels in an arrayed form. A thin film transistor and the display element are provided for each pixel for an active matrix type. The thin film transistor drives the display element with an external signal from the flexible printed circuit 160 or a signal from the signal line driving circuit 140 and displays a still image or a video on the display part 110. For the display element, for example, the organic EL element is used. The display part 110 is connected to the signal line driving circuit 140 and the flexible printed circuit 160 using a wiring provided in the substrate 100.

The scanning line driving circuit 120 outputs signals to scanning lines in the display part 110. The scanning line driving circuit 120 can be constructed of the thin film transistors.

The signal line driving circuit 140 outputs signals to signal lines in the display part 110. The signal line driving circuit 140 can be constructed of the Integrated Circuit such as driver IC (Integrated Circuit) or the like.

The flexible printed circuit 160 can receive signals from an external circuit and transmit the signals to the signal line driving circuit 140. The flexible printed circuit 160 has a plurality of wirings on a resin substrate having a flexibility and is electrically connected to the terminal part 150 provided on the substrate 100. The signal line driving circuit 140 may be arranged on the flexible printed circuit 160.

The region outside of the display part 110 and in which the signal line driving circuit 140 and the terminal part 150 are arranged can be referred to as the peripheral part 300. And also, the region between the display part 110 and the peripheral part 300 can be referred to as the intermediate region 130. The display device 10 can be bent at the intermediate region 130.

Figure 2:
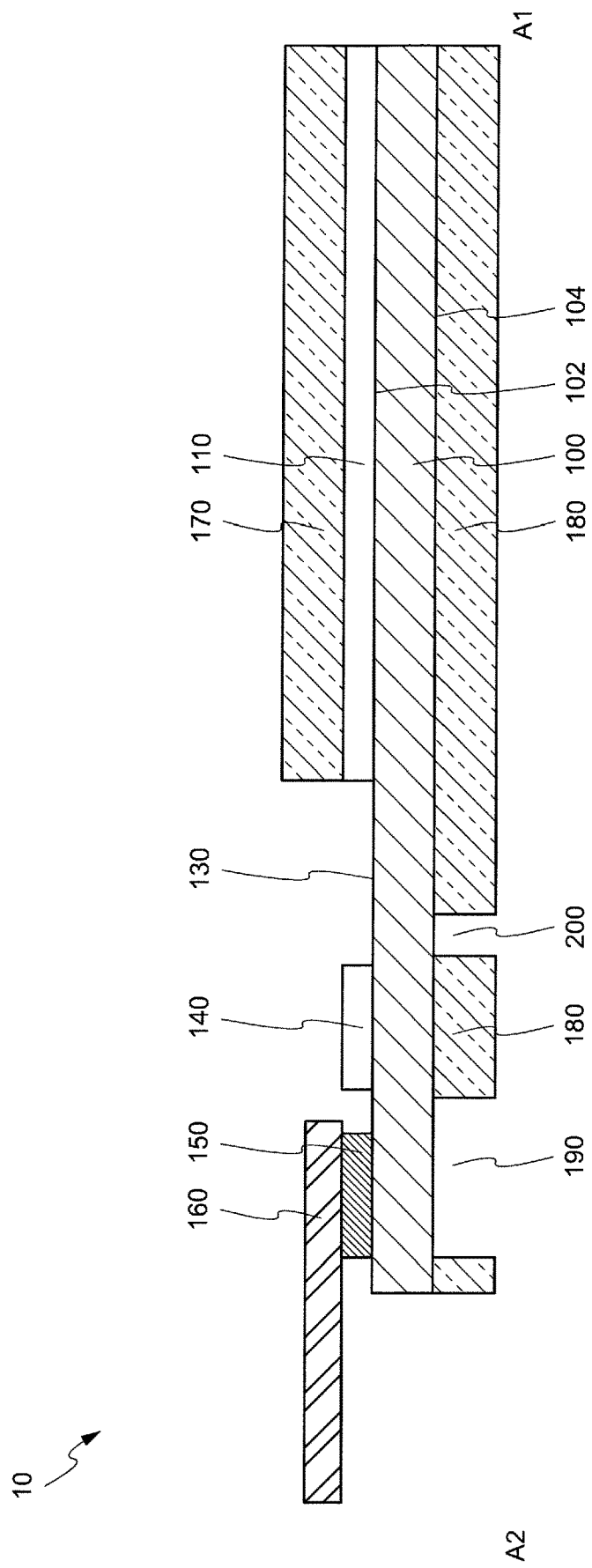
FIG. 2 is a cross-sectional view of a display device according to an embodiment of the present invention, showing a cross-sectional structure corresponding to A1-A2 line shown in FIG. 1.

FIG. 2 is a cross-sectional view of the display device 10 according to an embodiment of the present invention, showing a cross-sectional structure corresponding to A1-A2 line shown in FIG. 1. As shown in FIG. 2, the display device 10 includes the substrate 100, the display part 110, the signal line driving circuit 140, the terminal part 150, and the flexible printed circuit 160 described above. The display device 10 additionally includes the protective layer 170, a protective member 180, a first opening 190, and a second opening 200. In this embodiment, the organic EL element is used as the display element for the display part 110.

As shown in FIG. 2, the substrate 100 includes a first surface 102 and a second surface 104 opposite to the first surface 102. The display part 110, the signal line driving circuit 140, the terminal part 150, the flexible printed circuit 160, and the protective layer 170 are arranged on the first surface 102 of the substrate. On the other hand, a protective member 180 provided with a first opening 190 and a second opening 200 is arranged on the second surface 104 of the substrate 100.

The protective layer 170 is provided on the display part 110. The protective layer 170 has a function of protecting the display part 110. The protective layer 170 may be used the same material as the protective member 180 or may be used combinations of other materials. The protective layer 170 may be a film-like material, a resin-cured material, or combinations thereof as appropriate. The protective layer 170 is provided on the display part 110 and is preferably colorless and transparent. A polarization film may be provided on the protective layer 170 as appropriate. The protective layer 170 may be formed of a polarization film (e.g., circular polarization film).

The protective member 180 has a function of protecting an object. An organic resin film is used for the protective member 180. For example, a film containing polyimides, acrylics, epoxies, polyethylene terephthalates, or silicone-based organic resins is used as the protective member 180. Alternatively, the protective member 180 may be formed of the above-mentioned organic resin film containing inorganic materials. Alternatively, a metallic material such as stainless steel, copper, etc. may be used for the protective member 180. The thickness of the protective member 180 may be any thickness that can protect the display device 10. For example, the thickness of the protective member 180 may be appropriately set to the range of 100 μm to 200 μm. The part of the protective member 180 corresponding to the peripheral part 300 may be a first protective member 182. The part for the display part 110 may be a second protective member 184. In other words, the part overlapping the display part 110 may be the second protective member 184.

The protective member 180 includes the first opening 190. The first opening 190 is located on the second surface 104 and can be provided on the protective member 180 to expose a first region including a region overlapping the terminal part 150. The first opening 190 is located on the second surface 104 and may be provided on the protective member 180 to expose a second region if the second surface 104 of the substrate 100 has the second region that the surface is rougher than the first region. In this example, the first opening 190 is located on the second surface 104 and is provided on the protective member 180 to expose the first region including the region overlapping the terminal part 150.

The protective member 180 may include the second opening 200. The second opening 200 may be provided on the protective member 180 so as to expose a third region including a region located on the second surface 104 and overlapping with the intermediate region 130. In this instance, the second opening 200 is located on the second surface 104 and is provided on the protective member 180 so as to expose the third region including the region of the protective member 180 that overlaps the intermediate region 130.

Figure 3:
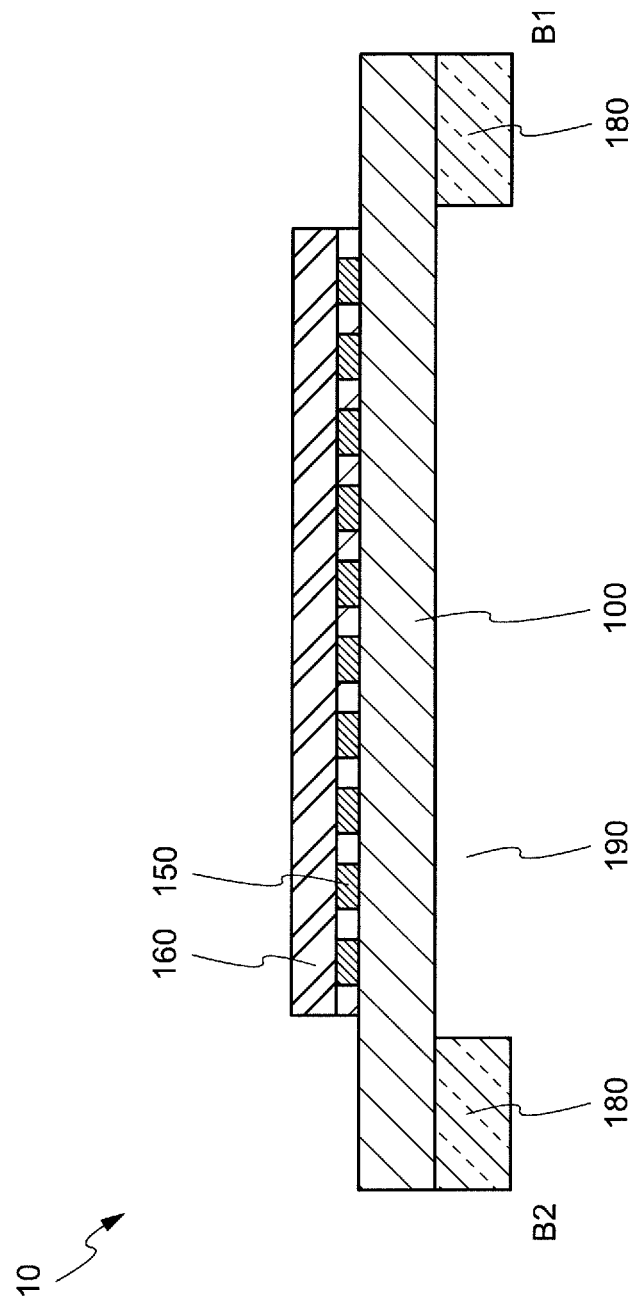
FIG. 3 is a cross-sectional view of a display device according to an embodiment of the present invention, showing a cross-sectional structure corresponding to B1-B2 line shown in FIG. 1.

FIG. 3 is a cross-sectional view of the display device 10 according to an embodiment of the present invention, showing a cross-sectional structure corresponding to B1-B2 line shown in FIG. 1. As shown in FIG. 3, the display device 10 includes the substrate 100, the terminal part 150, the flexible printed circuit 160, the protective member 180, and the first opening 190 described above.

As described above, the first opening 190 may be provided on the protective member 180 to expose the first region located on the second surface 104 and including a region overlapping the terminal part 150. On the other hand, the protective member 180 may be provided in a region that is located on the second surface 104 and does not include the region that overlaps with the terminal part 150.

Figure 4:
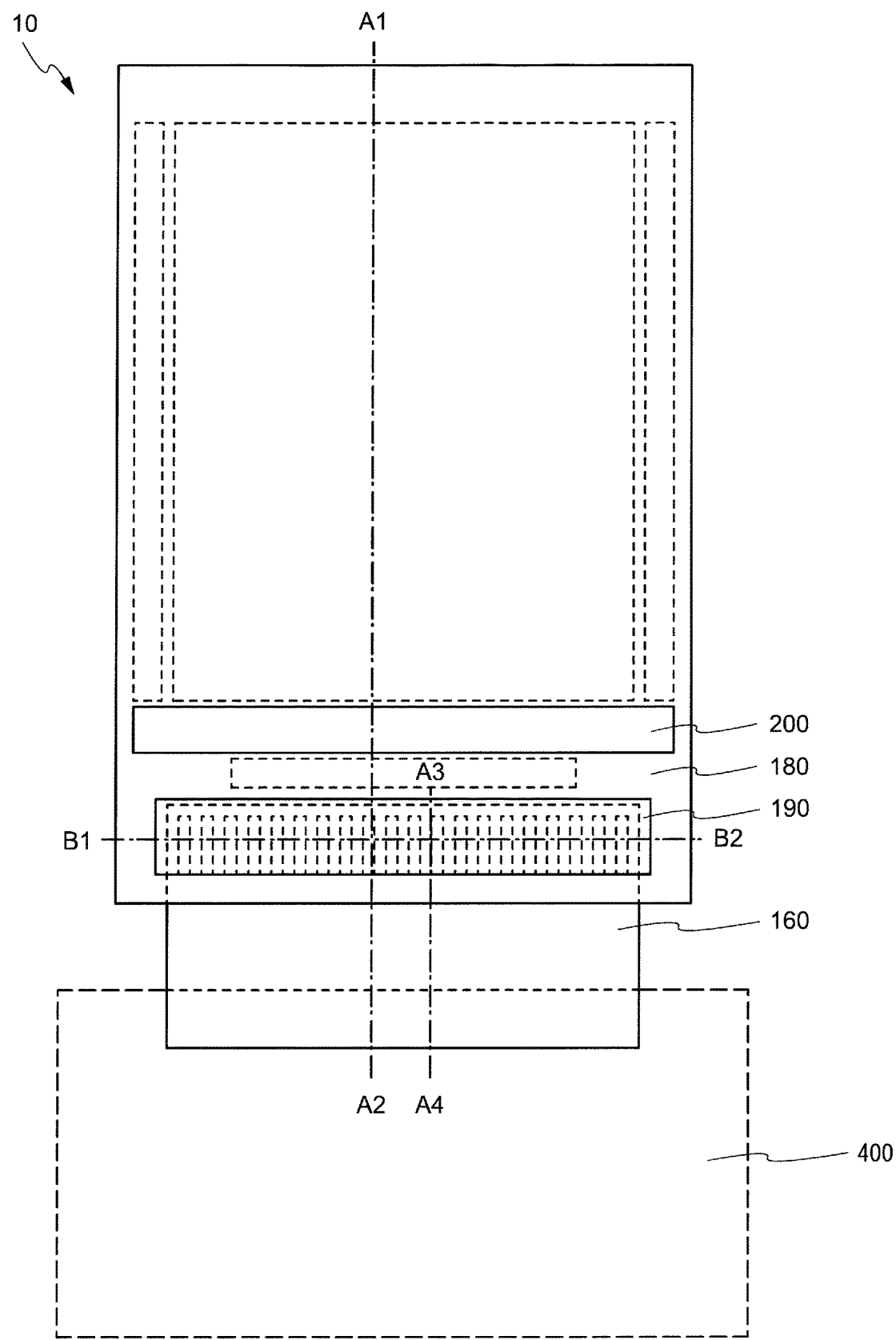
FIG. 4 is a planar view of a display device according to an embodiment of the present invention, showing a configuration as viewed from the substrate.

FIG. 4 is a planar view of the display device according to an embodiment of the present invention and shows a configuration when viewed from the substrate 100 side (the side where the protective member 180 of the substrate 100 is located). As shown in FIG. 4, the display device 10 includes the flexible printed circuit 160, the protective member 180, the first opening 190, and the second opening 200 described above. The optional region 400 may be connected to the flexible printed circuit 160.

As described above, the first opening 190 is located on the second surface 104 and is not provided with the protective member 180. The first opening 190 is located on the second surface 104 and may be provided on the protective member 180 to expose the second region if the second surface 104 of the substrate 100 has the second region that the surface is rougher than the first region. In this example, the first opening 190 is located on the second surface 104 and is provided on the protective member 180 to expose the first region including the region overlapping the terminal part 150. The second opening 200 is located on the second surface 104 and is the part where the protective member 180 is not located. In this instance, the second opening 200 is located on the second surface 104 and is provided on the protective member 180 so as to expose the third region including the region of the protective member 180 that overlaps the intermediate region 130.

Configuration of Folded Display Device

Figure 5:
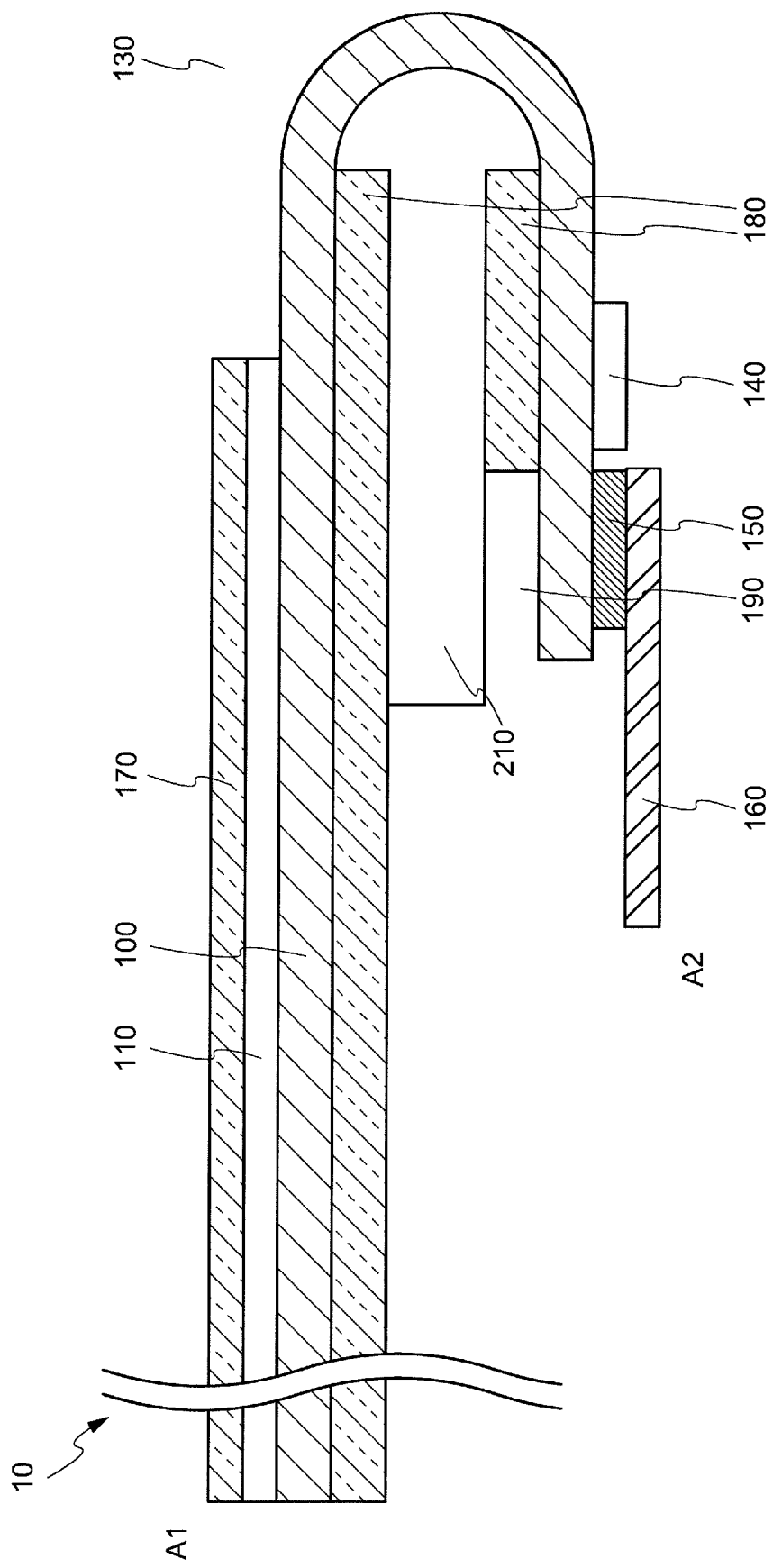
FIG. 5 is a cross-sectional view according to an embodiment of the present invention, showing a cross-sectional view after folding of a display device.

FIG. 5 is a cross-sectional view according to an embodiment of the present invention showing a cross-sectional structure of the display device after folding. As shown in FIG. 5, the display device 10 includes the substrate 100 described above, the display part 110 includes the intermediate region 130, the signal line driving circuit 140, the terminal part 150, the flexible printed circuit 160, the protective member 180, the first opening 190, the second opening 200, and further includes a spacer 210.

The display device 10 is folded at the intermediate region 130 of the substrate 100, and the display part 110 and the peripheral part 300 overlapping each other in a planar view.

As shown in FIG. 5, the spacer 210 is arranged corresponding to the intermediate region 130. A portion of the spacer 210 is located between the display part 110 and the peripheral part 300. The spacer 210 is preferably formed from a material that is thicker and more rigid than the substrate. The spacer 210 is not necessarily provided. A thermal diffusion sheet may be provided between the protective member 180 and the spacer 210. A metal material such as stainless steel or copper can be used as the thermal diffusion sheet.

The substrate 100 is folded at the intermediate region 130. The substrate 100 can be easily folded because the protective member 180 is not arranged in the third region that is located on the second surface 104 and includes the region that overlaps the intermediate region 130. The radius of curvature of the substrate 100 of the intermediate region 130 is as small as 0.4 mm.

The first opening 190 is located on the second surface 104 and is provided on the protective member 180 to expose the first region including the region overlapping the terminal part 150. The second surface 104 corresponding to the terminal part 150 is deformed due to the crimping connection between the substrate 100 and the flexible printed circuit 160, and the flatness of the substrate 100 is reduced. Therefore, when the protective member 180 is located on the second surface 104 and arranged with respect to the terminal part 150, there is a possibility that the display part 110 and the peripheral part 300 may not overlap each other in a planar view. Such a problem can be avoided by providing the 1st opening 190, and the reliability of the display device using the flexible substrate can be improved.

The display device 10 having the above structures, when viewed from side as shown in FIG. 5, the signal line driving circuit 140 and the flexible printed circuit 160 will be arranged on the back side of the display part 110. That is, the display device 10 can be miniaturized by the above-described structure in which one end of the substrate 100 is fold.

Figure 6:
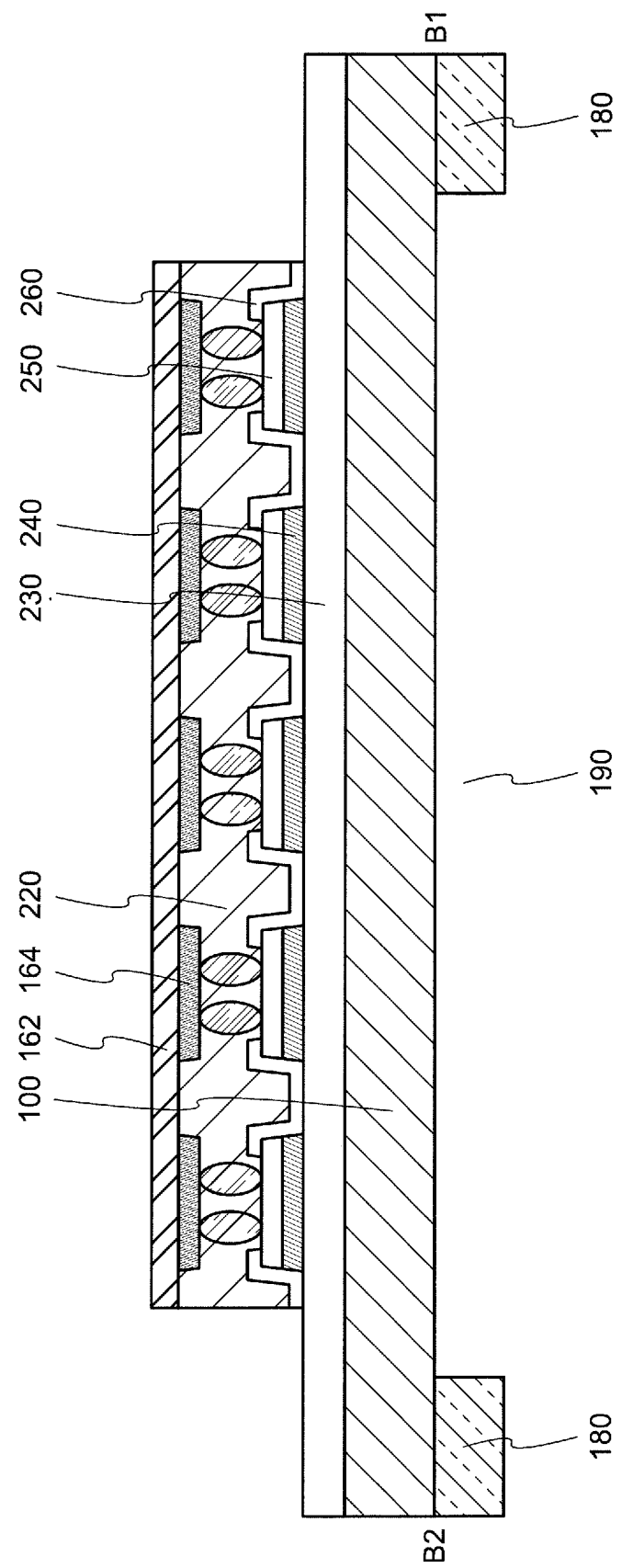
FIG. 6 is a cross-sectional view according to an embodiment of the present invention, showing a terminal part and the flexible printed circuit corresponding to B1-B2 line shown in FIG. 1.

Structure of Connection Part Between the Terminal Part and the Flexible Printed Circuit FIG. 6 is a cross-sectional view according to an embodiment of the present invention, showing a cross-sectional structure of the terminal part and the flexible printed circuit substrate corresponding to B1-B2 line shown in FIG. 1. As shown in FIG. 6, the connection part of terminal part and the flexible printed circuit includes an anisotropic conductive film 220 in addition to the substrate 100, the terminal part 150, the flexible printed circuit 160, and the protective member 180 described above.

The terminal part 150 is configured on the substrate 100 and includes a first insulating film 230, an electrode 240, an inorganic film 250, and a second insulating film 260.

The flexible printed circuit 160 includes a base film 162 and a wiring 164.

The anisotropic conductive film 220 is formed by mixing fine metallic beads with a thermosetting resin. The anisotropic conductive film 220 is an adhesive capable of exhibiting conductivity, thereby the terminal part 150 and the flexible printed circuit 160 are physically and electrically connected.

On the substrate 100, the first insulating film 230 is provided for insulating. As the first insulating film 230, for example, silicon oxide ($SiO_x$) film, silicon nitride ($Si_xN_y$) film, or an inorganic insulating film such as silicon oxide ($SiO_xN_y$) film can be used or may also have a stacked layer structure of those.

On the first insulating film 230, the electrode 240 is provided. The electrode 240 is connected (not shown) to a source electrode and a drain electrode at the display part 110.

The inorganic film 250 is provided on the electrode 240. As the inorganic film 250, for example, ITO or the like is used.

On the inorganic film 250, the second insulating film 260 is provided for insulating. For example, as the second insulating film 260, an inorganic insulating film such as the above-described silicon oxide ($SiO_x$) film, silicon nitride ($Si_xN_y$) film, or silicon oxynitride ($SiO_xN_y$) film can be used or may also have a stacked layer structure of those.

The base film 162 is a resin film having an electrically insulating property and a flexibility. As the base film 162, for example, a resin such as a polyimide resin, a polyethylene terephthalate resin, a polybutylene terephthalate resin, a polyamide resin, a polycarbonate resin, or a polyether sulfone resin is used.

For example, a copper foil or the like is used as the wiring 164.

Figure 7:
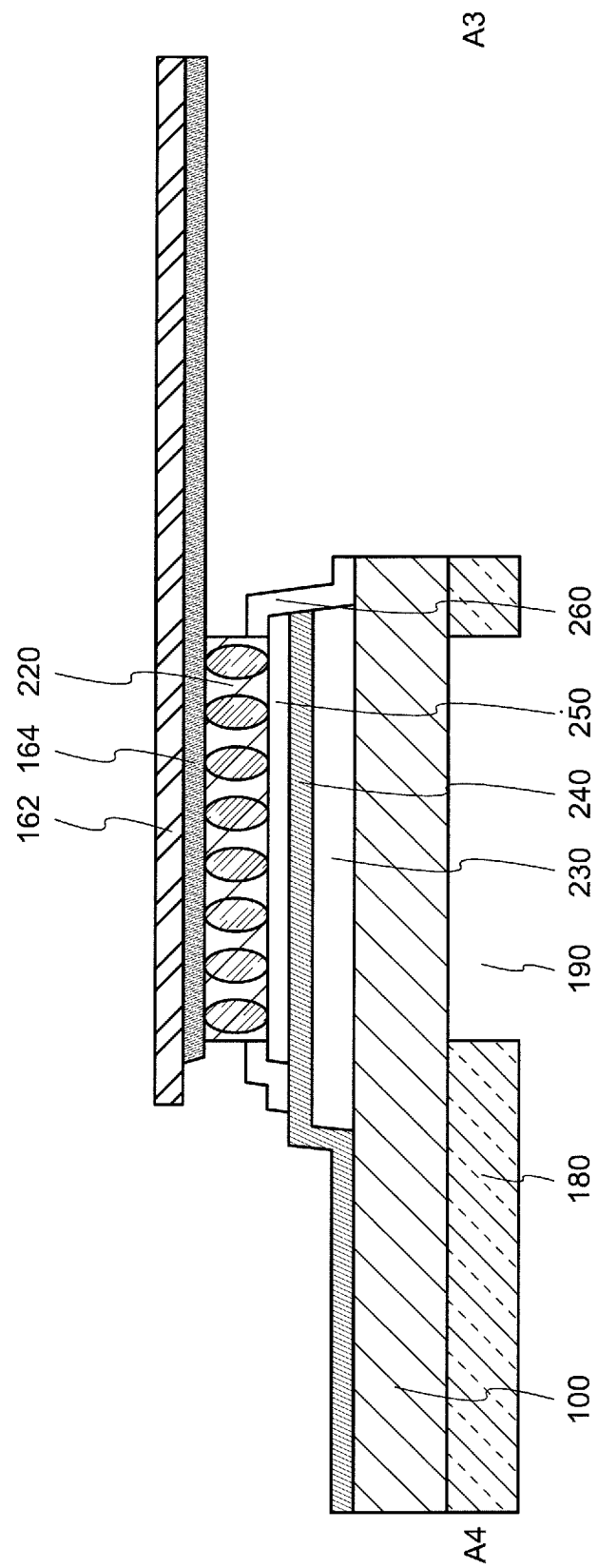
FIG. 7 is a cross-sectional view according to an embodiment of the present invention, showing a cross-sectional structure of the terminal part and the flexible printed circuit corresponding to A3-A4 line shown in FIG. 1.

FIG. 7 is a cross-sectional view according to an embodiment of the present invention, showing a cross-sectional structure of the terminal part and the flexible printed circuit corresponding to A3-A4 line shown in FIG. 1. As shown in FIG. 7, the connection part between the terminal part and the flexible printed circuit includes the substrate 100, the terminal part 150, the flexible printed circuit 160, the protective member 180, and the anisotropic conductive film 220 described above. The terminal part 150 includes the first insulating film 230, the electrode 240, the inorganic film 250, and the second insulating film 260. The flexible printed circuit includes the base film 162 and the wiring 164 described above.

A wiring extending from the display part 110 is connected (not shown) to the signal line driving circuit 140, and further the wiring extends toward one side of the substrate 100 and is exposed at the end of the substrate 100 to form the terminal part 150. The terminal part 150 is connected to the wiring 164 of the flexible printed circuit, a signal for reproducing the image is supplied from the external circuit (not shown) to the scanning line driving circuit 120, the signal line driving circuit 140 through the wiring 164, the terminal part 150.

First Embodiment

The display device 10 according to the first embodiment can prevent the sticking failure between the substrate 100 and the protective member 180, it is possible to improve the reliability of the display device 10 using the flexible board. Hereinafter, a configuration for realizing this will be described.

Figure 8:
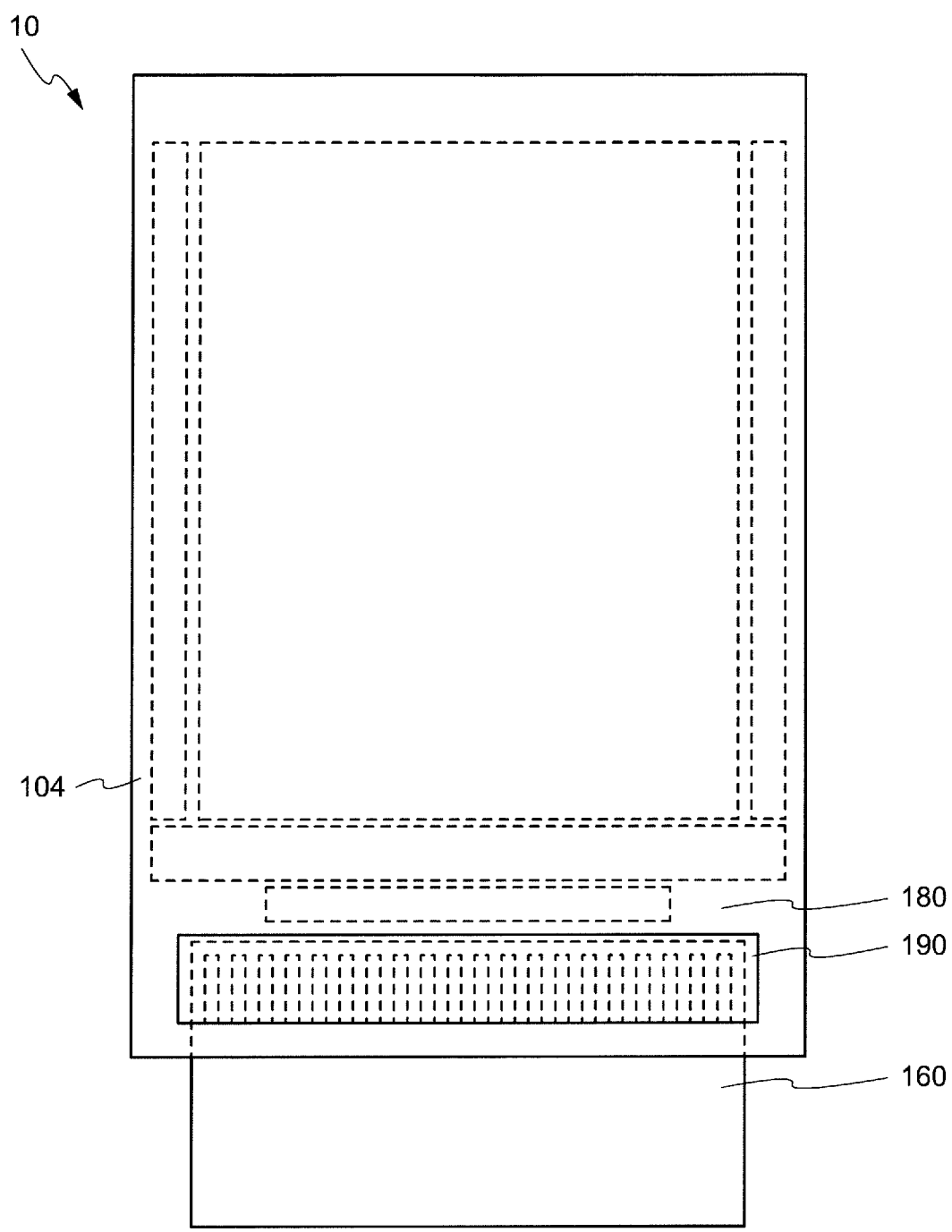
FIG. 8 is a planar view of a display device according to an embodiment of the present invention, showing a configuration when viewed from the substrate side.

FIGS. 8 to 11 are planar view of the display device according to an embodiment of the present invention and show a configuration when viewed from the substrate 100 side. As shown in FIG. 8, the display device 10 includes the flexible printed circuit 160, the protective member 180, and the first opening 190 described above. The first opening 190 is located on the second surface 104 and is provided on the protective member 180 to expose a region that overlaps the terminal part 150. In the first embodiment, the second opening 200 may be provided similarly to FIG. 4, but the explanation thereof is omitted here.

Figure 9:
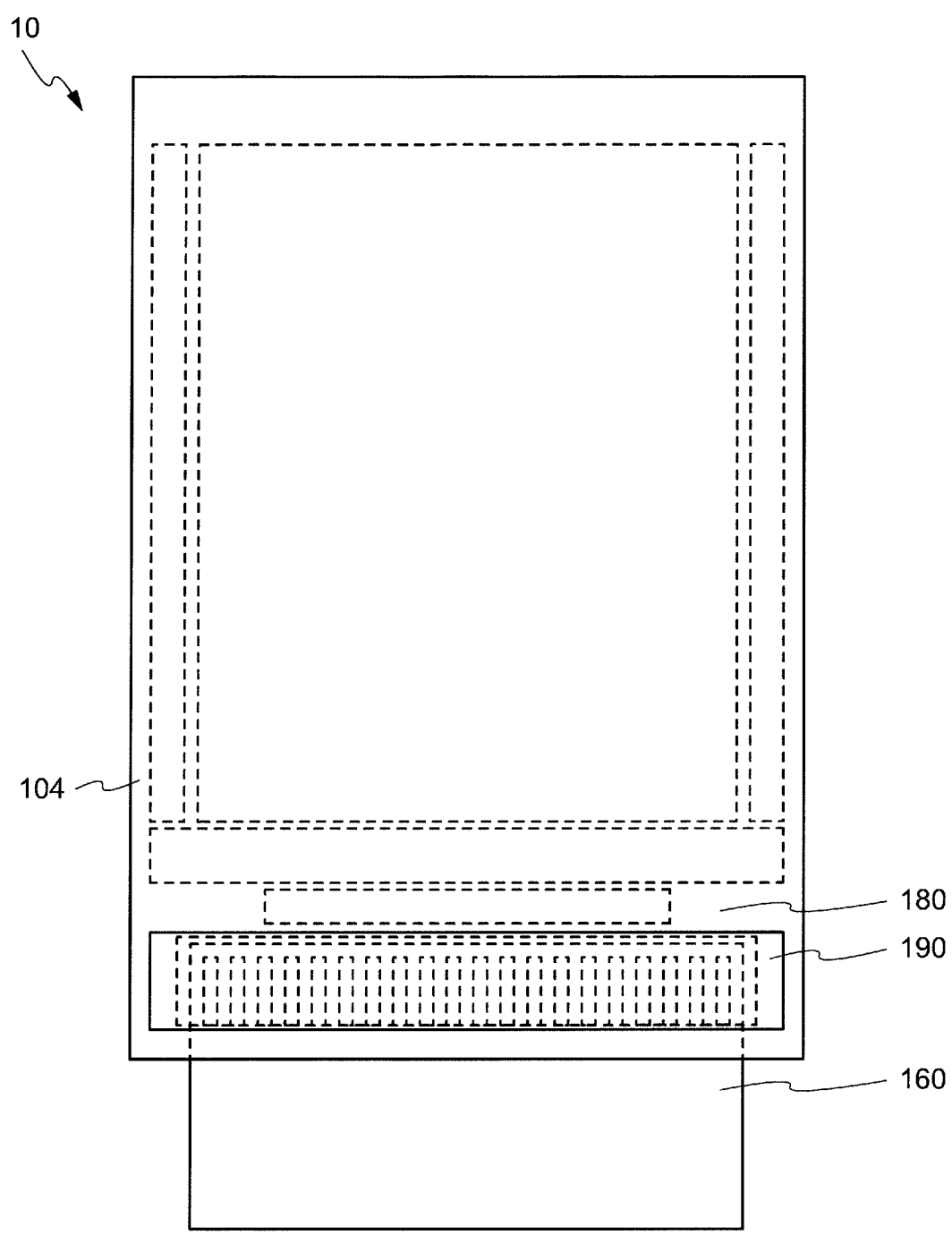
FIG. 9 is a planar view of a display device according to an embodiment of the present invention, showing a configuration when viewed from the substrate side.

Further, as shown in FIG. 9, by making the size of the first opening 190 larger than the first opening 190 in FIG. 8, the first opening 190 is provided in the protective member 180 so as to expose the first region including the region located on the second surface 104 side and overlapping the terminal part 150.

Figure 10:
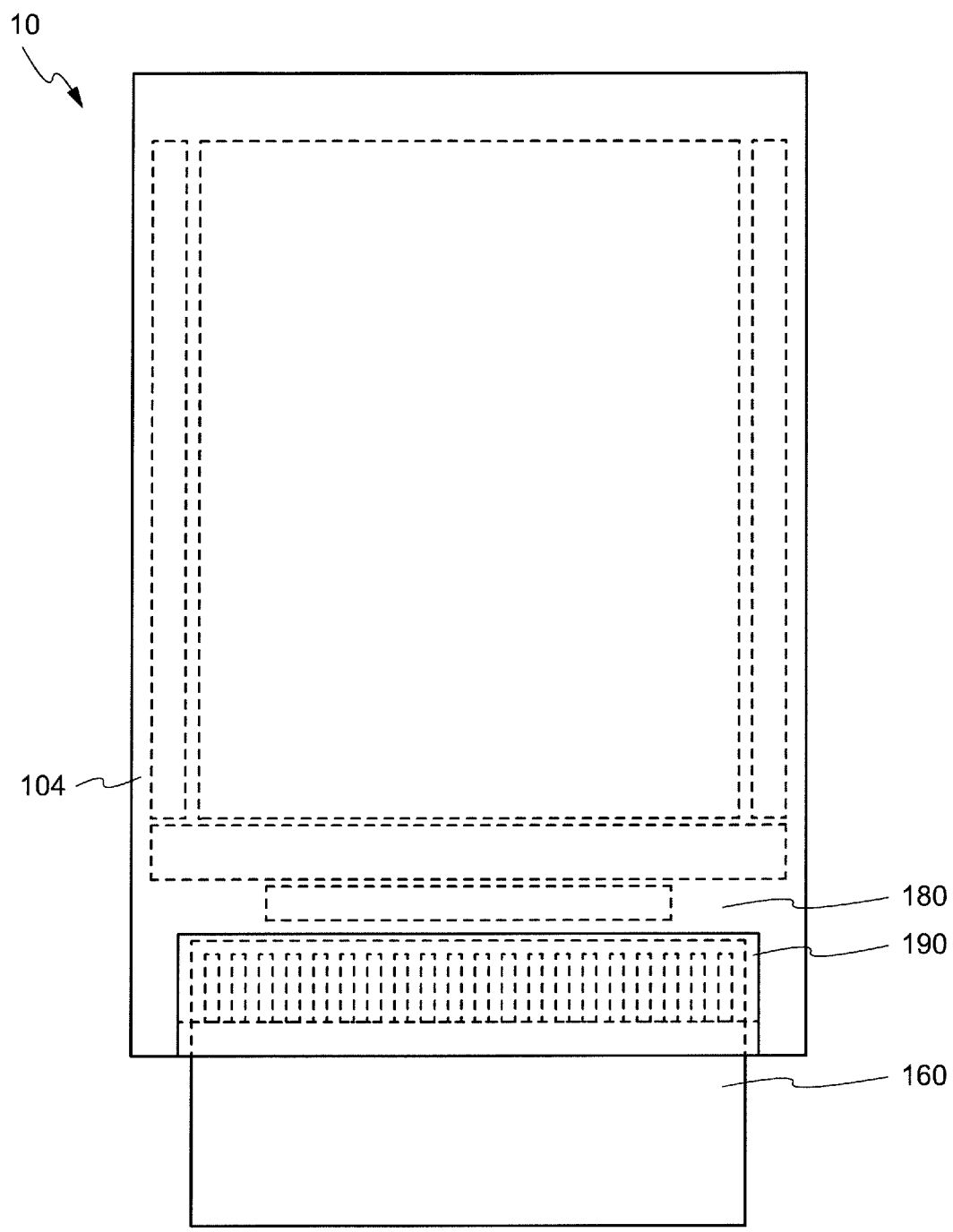
FIG. 10 is a planar view of a display device according to an embodiment of the present invention, showing a configuration as viewed from the substrate side.
Figure 11:
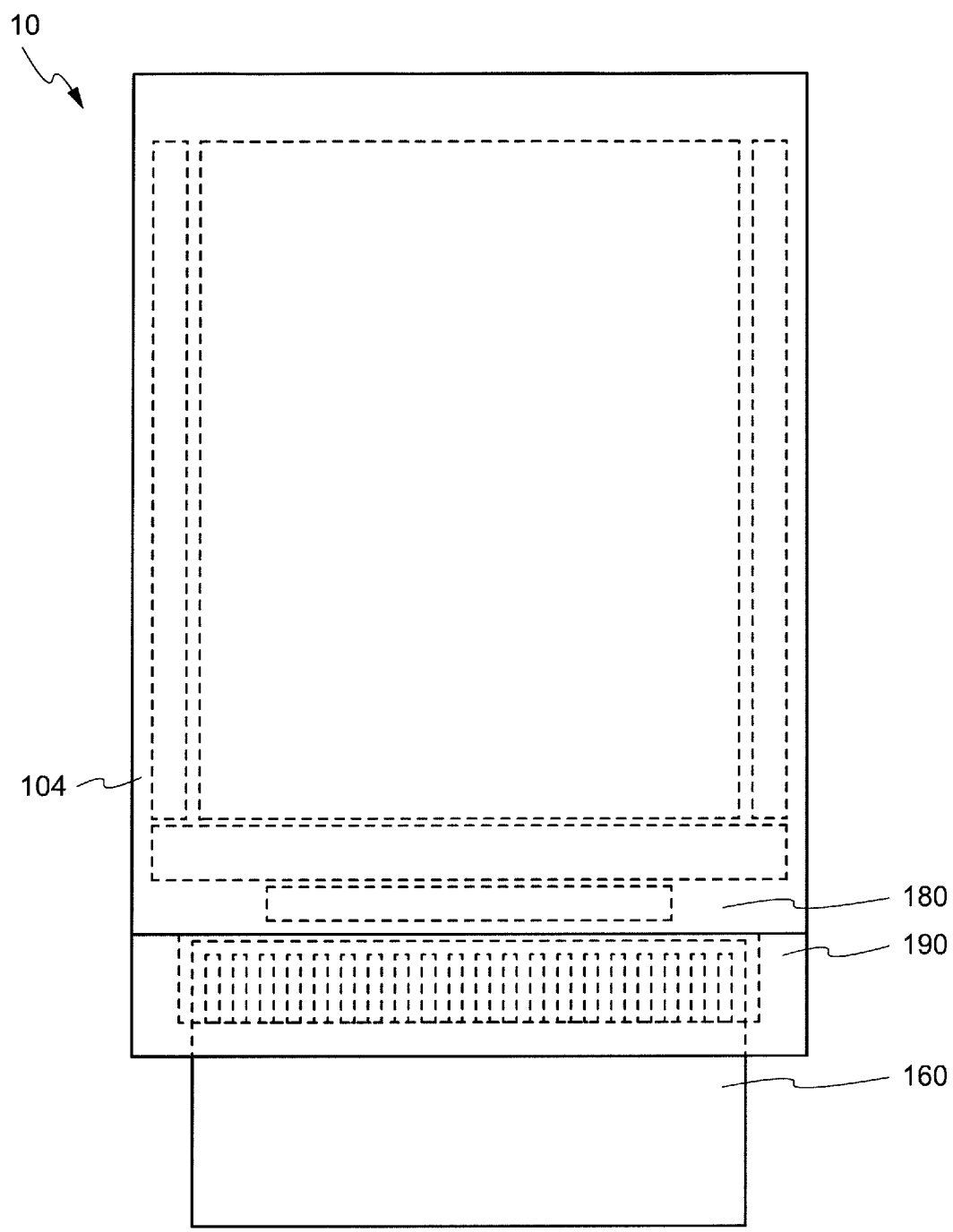
FIG. 11 is a planar view of a display device according to an embodiment of the present invention, showing a configuration as viewed from the substrate side.
Figure 12:
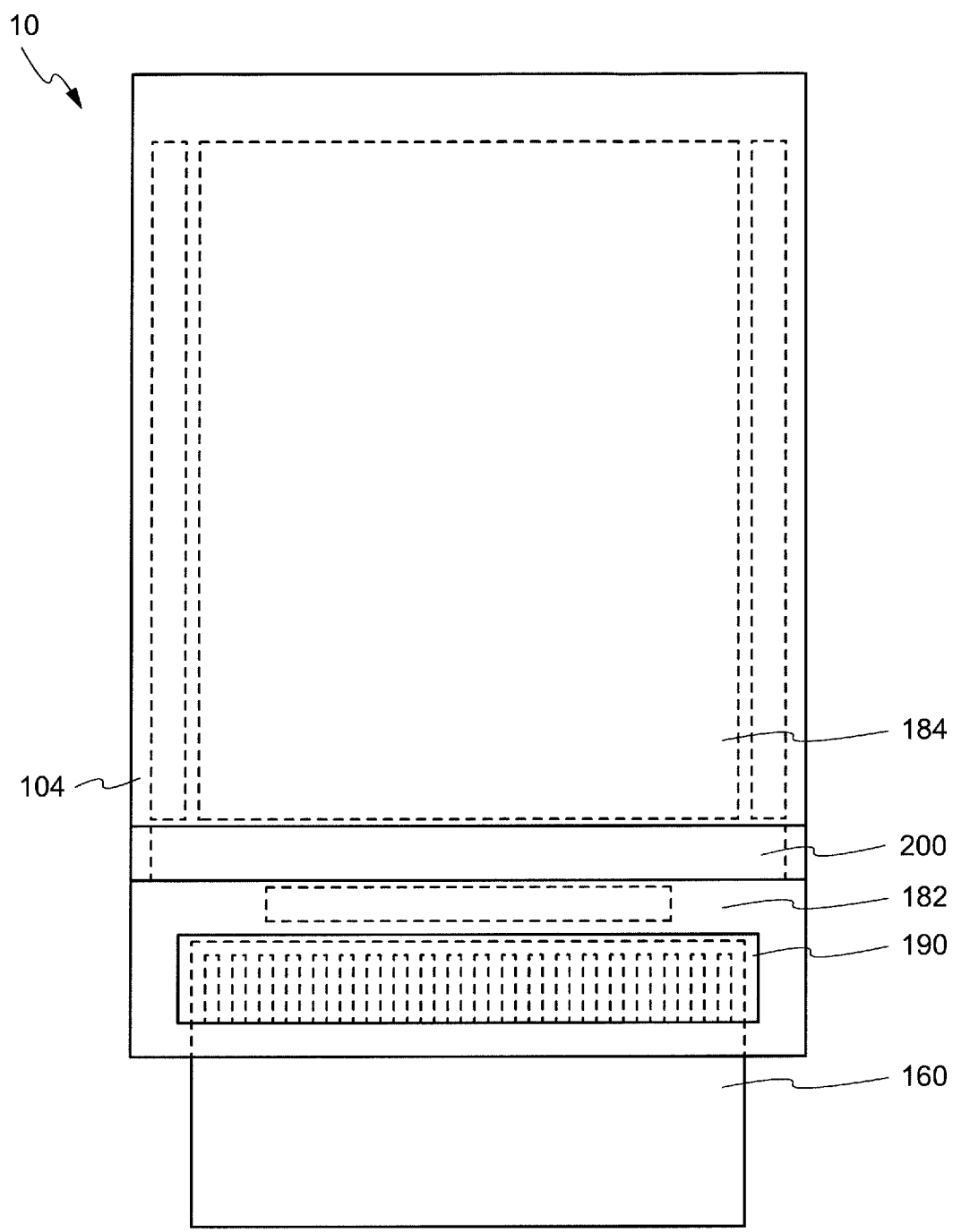
FIG. 12 is a planar view of a display device according to an embodiment of the present invention, showing a configuration as viewed from the substrate side.
Figure 13:
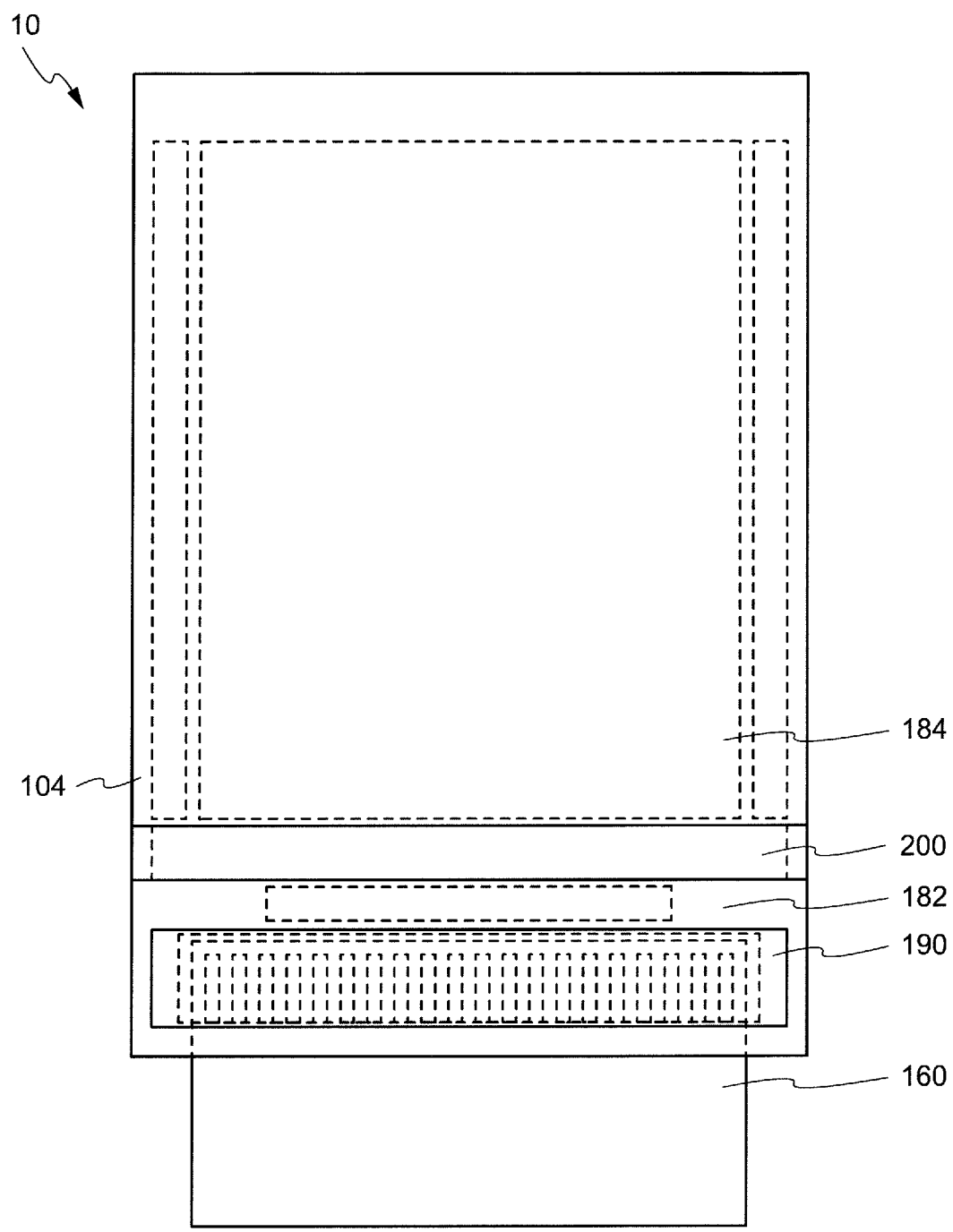
FIG. 13 is a planar view of a display device according to an embodiment of the present invention, showing a configuration when viewed from the substrate side.
Figure 14:
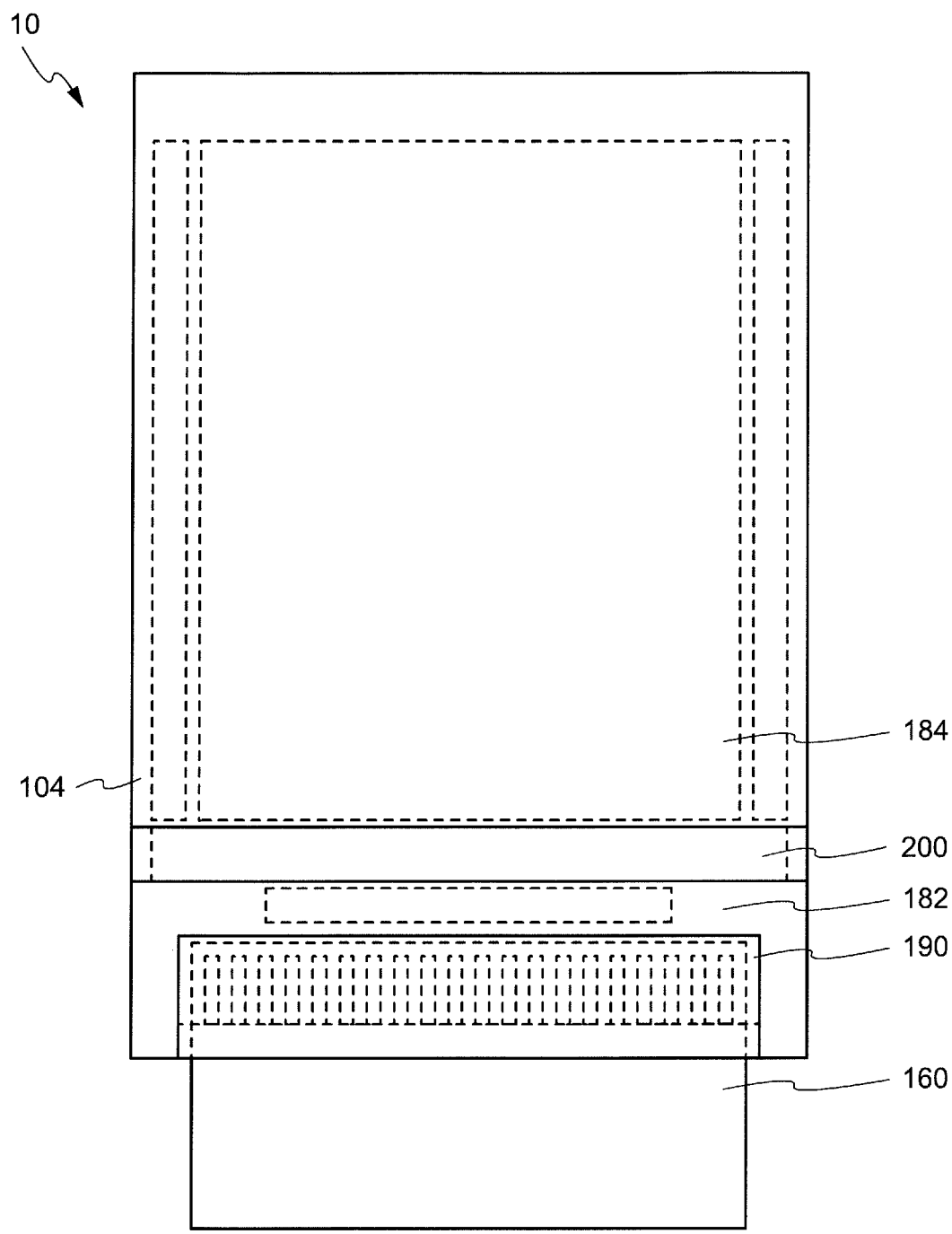
FIG. 14 is a plane view of a display device according to an embodiment of the present invention, showing a configuration as viewed from the substrate side.
Figure 15:
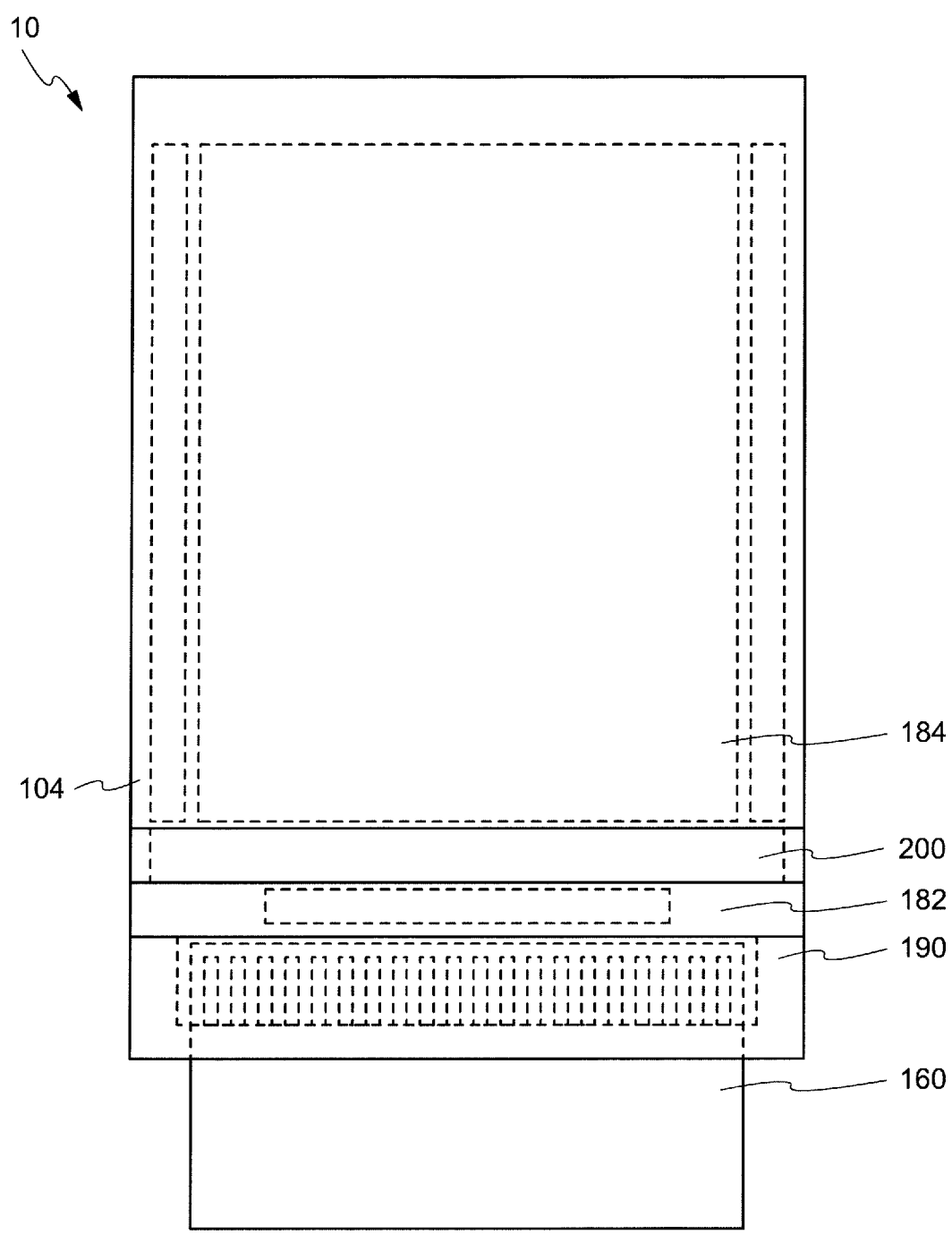
FIG. 15 is a planar view of a display device according to an embodiment of the present invention, showing a configuration as viewed from the substrate side.

Further, the first opening part 190 is located on the second surface 104 and includes a region to the terminal part 150. The first opening part 190 may extend to one end on the side of the terminal portion 150 on the substrate 100 as shown in FIG. 10. The first opening 190 may extend to both ends of the substrate 100 on the scanning line drive circuit 120 as shown in FIG. 11.

As described above, when the display device 10 includes the protective member 180 having a first opening 190 provided on the second surface 104 of the substrate 100 so as to correspond to the terminal part 150, it is possible to prevent the contact between the substrate 100 and the protective member 180, and to prevent poor adhesion between the substrate 100 and the protective member 180.

Second Embodiment

The display device 10 according to the second embodiment differs from the display device according to the first embodiment in that the protective member 180 arranged with respect to the intermediate region 130 has a second opening 200 which extends to both ends on the scanning line drive circuit 120. Hereinafter, the difference from those of the first embodiment will be described.

FIGS. 12 to 15 are planar view of the display device according to an embodiment of the present invention and show a configuration when viewed from the substrate 100 side. As shown in FIGS. 12 to 15, the display device 10 includes the flexible printed circuit 160 and the first opening 190 described above. In addition, the second opening 200 is provided on the protective member 180 to expose the third region, which is located on the second surface 104 and includes a region overlapping the intermediate region 130. Since the second opening 200 extends to both ends of the scanning line driving circuit 120 of the substrate 100, the protective member 180 is divided into the first protective member 182 for the peripheral part 300 and the second protective member 184 for the display part 110.

On the other hand, as shown in FIGS. 12 to 15, since the first opening 190 is the same as that of the first embodiment, its explanation is omitted here.

Since the display device 10 includes the first protective member 182 having the second opening 200 located on the second surface 104 and arranged with respect to the intermediate region 130, the substrate 100 can be easily fold. Furthermore, since the first protective member 182 has the first opening 190 located on the second surface 104 and arranged with respect to the terminal part 150, contact between the substrate 100 and the first protective member 182 is eliminated. Therefore, the adhesion failure between the substrate 100 and the first protective member 182 can be prevented, and the reliability of the display device 10 using the flexible substrate can be improved.

Third Embodiment

The display device 10 according to the third embodiment differs from the first embodiment and the second embodiment in that the first protective member 182 has a structure in which the first opening 190 and the second opening 200 are integrated. Hereinafter, the difference from the first embodiment and the second embodiment will be described.

Figure 16:
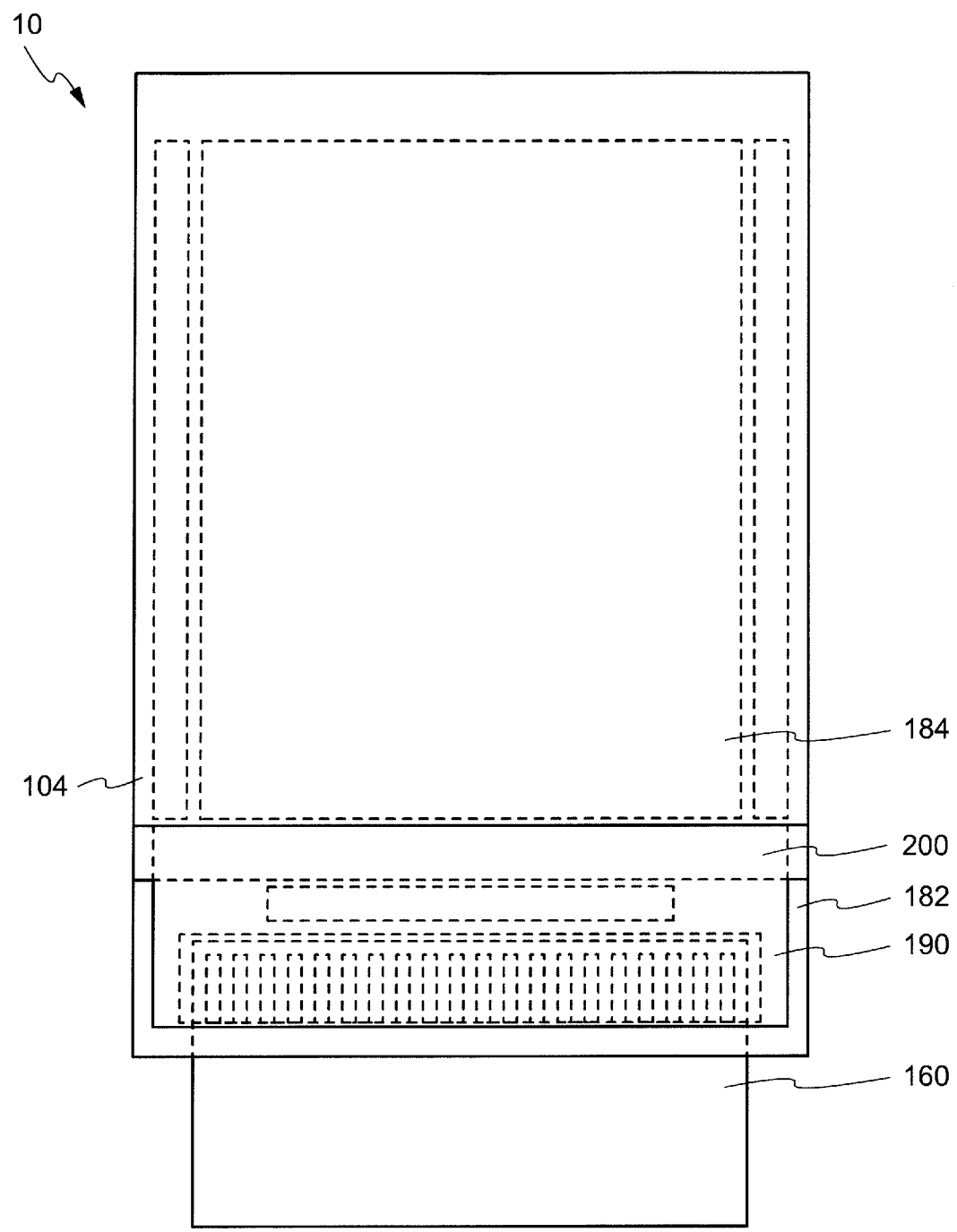
FIG. 16 is a planar view of a display device according to an embodiment of the present invention, showing a configuration as viewed from the substrate side.
Figure 17:
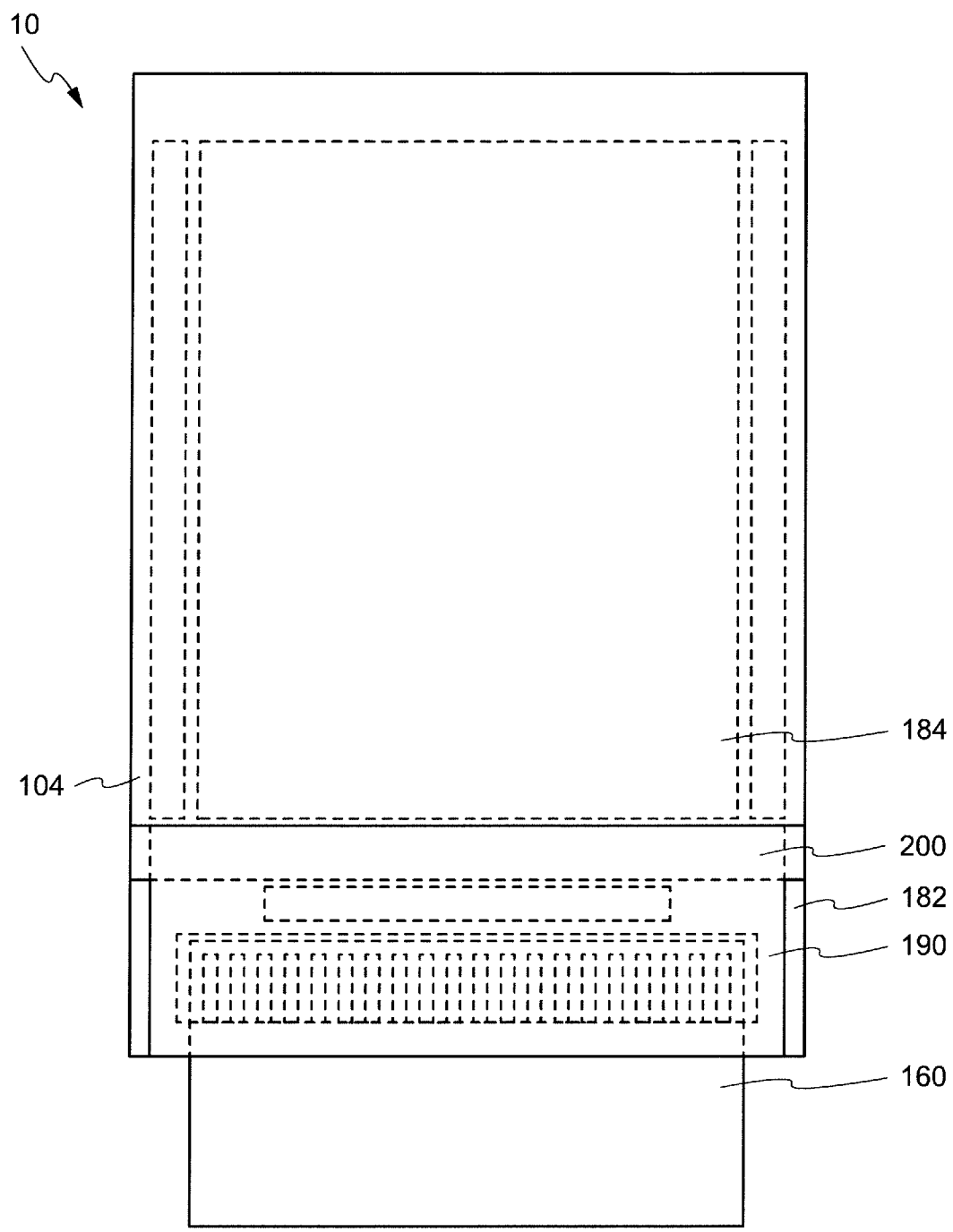
FIG. 17 is a planar view of a display device according to an embodiment of the present invention, showing a configuration as viewed from the substrate side.
Figure 18:
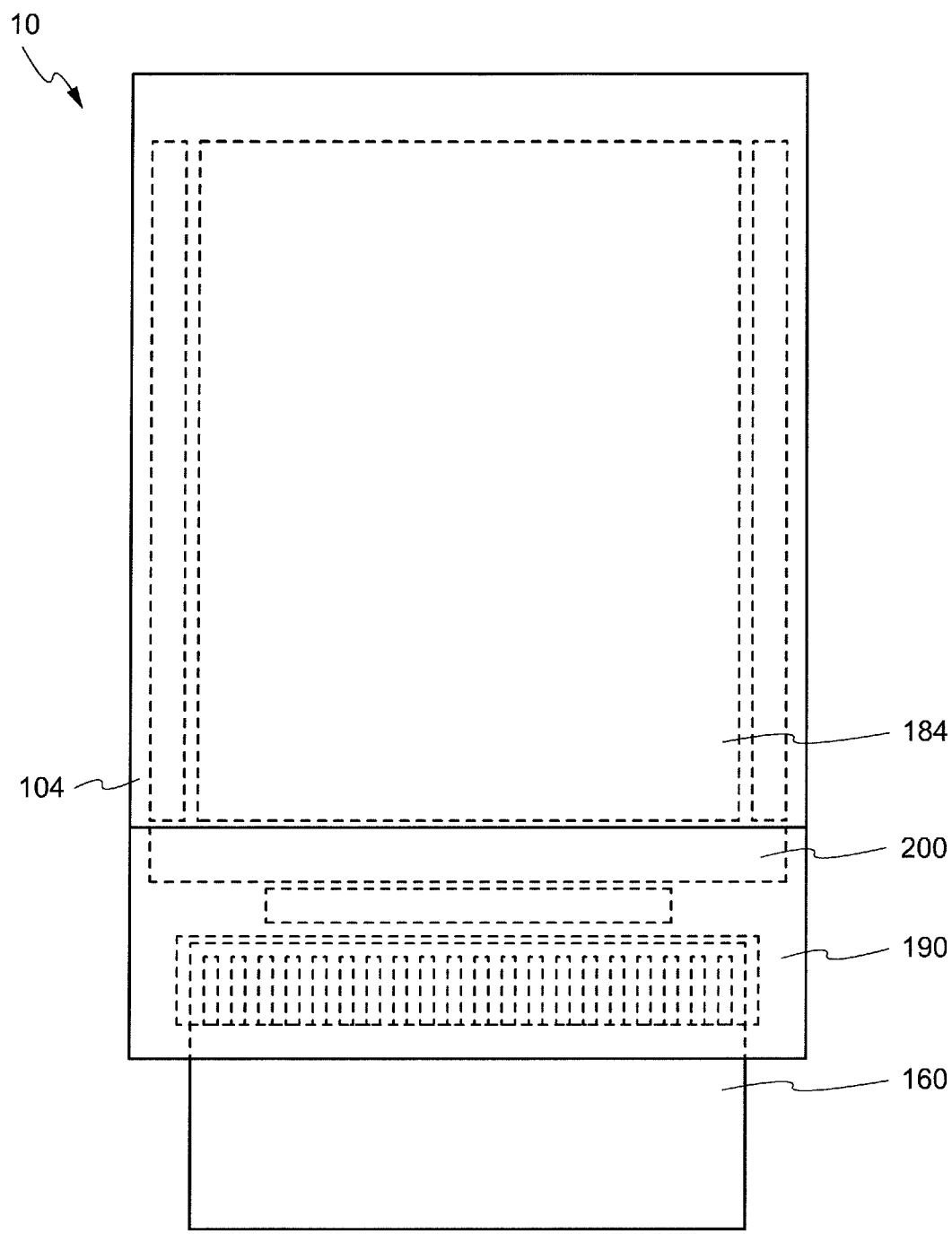
FIG. 18 is a planar view of a display device according to an embodiment of the present invention, showing a configuration when viewed from the substrate side.

FIGS. 16 to 18 are planar view of the display device according to an embodiment of the present invention and show a configuration when viewed from the substrate 100 side. As shown in FIGS. 16 to 18, the display device 10 includes the flexible printed circuit 160 described above, the first protective member 182, the second protective member 184, the first opening 190, and the second opening 200. The first opening 190 and the second opening 200 are integrated.

The opening where the first opening 190 and the second opening 200 are integrated, as shown in FIG. 16, the first opening 190 may or may not extend to either end of the terminal part 150 and the scanning line driving circuit 120, as shown in FIG. 17, the first opening 190 may extend to one end of the terminal part 150 side of the substrate 100.

Further, as shown in FIG. 18, the first opening 190 may extend to both ends of the scanning line driving circuit 120 of the substrate 100. In this instance, since the first protective member 182 located on the side of the second surface 104 and located relative to the peripheral part 300 cannot be provided, the first protective member 182 can only be provided with the second protective member 184 located on the side of the second surface 104 and located relative to the display part 110.

As described above, since the display device 10 is provided with the second protective member 184 provided with the second opening 200 arranged with respect to the intermediate region 130 on the second surface 104 side, the substrate 100 can be easily fold. Further, the display device 10 can eliminate contact between the substrate 100 and the first protective member 182 and prevent adhesion failure between the substrate 100 and the first protection member 182 by providing the first protective member 182 with the opening where the first opening 190 and the second opening are integrated. Therefore, the reliability of the display device 10 using the flexible substrate can be improved.

Fourth Embodiment

The present embodiment exemplifies the case of the organic EL display device as a disclosed example, but other application examples include: the Liquid Crystal Display Device; other self-luminous type display device; an electronic paper type display device having an electrophoretic display element; and any flat-panel type display device. The one embodiment of the present invention is not only applied to a display device in which pixels are arranged in an array, but can be applied to other electronic devices such as devices in which sensor elements are arranged in an array.

Within the spirit of the present invention, it is understood that various modifications can be made by those skilled in the art, and these modifications also fall within the scope of the present invention. For example, as long as the gist of the present invention is provided, a person skilled in the art who adds, deletes, or changes the design of components, or adds, omits, or changes the conditions of processes to each of the above-described embodiments is included in the scope of the present invention.

What is claimed is:

1. A flexible substrate, comprising:
    a substrate having a first surface and a second surface opposite the first surface;
    an array part arranged on the first surface of the substrate;
    a peripheral part arranged on the first surface of the substrate and located outside the array part;
    a terminal part arranged in the peripheral part and provided with a plurality of terminals; and
    a protective member arranged on the second surface of the substrate;
    wherein the protective member includes a first opening corresponding, to the terminal part, and the protective member includes a second opening disposed in the peripheral part and disposed between the array part and the terminal part.

2. The flexible substrate according to claim 1, wherein the first opening extends to an end of the substrate on the terminal part side.

3. The flexible substrate according to claim 1, wherein the substrate includes a first end on a side of the terminal part, a second end facing the first end across the array part, and a third end different from the first end and the second end, and
    the first opening extends to third end.

4. The flexible substrate according to claim 1, wherein the first opening and the second opening are integrated openings.

5. The flexible substrate according to claim 4, wherein the integrated openings extends to an end of the substrate on the terminal part side.

6. The flexible substrate according to claim 4, wherein the substrate includes a first end on a side of the terminal part, a second end facing the first end, across the array part, and a third end different from the first end and the second end, and
    the integrated openings extends to the third end.

7. The flexible substrate according to claim 1, wherein the substrate is bent at the second opening of the protective member, and
    the array part and the peripheral part overlap with each other in planar view.

8. The flexible substrate according to claim 1, wherein the plurality of terminals is connected to a flexible printed circuit.

9. The flexible substrate according to claim 1, wherein the protective member includes a portion overlapping the array part.

* * * * *